United States Patent
Wallow et al.

(10) Patent No.: US 8,153,351 B2
(45) Date of Patent: Apr. 10, 2012

(54) METHODS FOR PERFORMING PHOTOLITHOGRAPHY USING BARCS HAVING GRADED OPTICAL PROPERTIES

(75) Inventors: Thomas I. Wallow, San Carlos, CA (US); Jongwook Kye, Pleasanton, CA (US)

(73) Assignee: Advanced Micro Devices, Inc., Austin, TX (US)

(*) Notice: Subject to any disclaimer, the term of this patent is extended or adjusted under 35 U.S.C. 154(b) by 697 days.

(21) Appl. No.: 12/255,514

(22) Filed: Oct. 21, 2008

(65) Prior Publication Data

US 2010/0099045 A1    Apr. 22, 2010

(51) Int. Cl.
G03F 7/09 (2006.01)
G03F 7/11 (2006.01)

(52) U.S. Cl. ............... 430/315; 430/270.1; 430/324; 430/330

(58) Field of Classification Search ............ 430/315, 430/324, 270.1, 330
See application file for complete search history.

(56) References Cited

U.S. PATENT DOCUMENTS

| | | | |
|---|---|---|---|
| 6,133,618 A * | 10/2000 | Steiner ............... | 257/646 |
| 6,255,036 B1 | 7/2001 | Tanaka et al. | |
| 7,300,730 B1 | 11/2007 | Willis et al. | |
| 7,816,069 B2 * | 10/2010 | Brodsky et al. ........ | 430/271.1 |
| 2008/0008955 A1 | 1/2008 | Brodsky et al. | |

FOREIGN PATENT DOCUMENTS

EP    0 901 156 A    3/1999

OTHER PUBLICATIONS

Joseph Kennedy et al., "A high-Si content middle layer for ArF trilayer patterning," Advances in Resist Materials and Processing Technology XXIV, Proc. of SPIE vol. 6923, 69230W, 2008, 10 pages.
Marc Weimer et al., "Materials for and performance of multilayer lithography schemes," Advances in Resist Materials and Processing Technology XXV, Proc. of SPIE vol. 6519, 65192S, 2007, 8 pages.
David J. Abdallah et al., "Etching spin-on trilayer masks," Advances in Resist Materials and Processing Technology XXV, Proc. of SPIE vol. 6923, 69230U, 2008, 8 pages.
Dario L. Goldfarb et al., "Graded spin-on organic bottom antireflective coating for high NA lithography," Advances in Resist Materials and Processing Technology XXV, Proc. of SPIE vol. 6923, 69230V, 2008, 14 pages.
Chris A. Mack et al., "Impact of think film metrology on the lithographic performance of 193nm bottom antireflective coatings," http://www.lithoguru.com/scientist/litho_papers/2007_BARC_Metrology.pdf, 2007, 16 pages.

(Continued)

Primary Examiner — Shean Wu
(74) Attorney, Agent, or Firm — Ingrassia Fisher & Lorenz, P.C.

(57) ABSTRACT

Photolithography methods using BARCs having graded optical properties are provided. In an exemplary embodiment, a photolithography method comprises the steps of depositing a BARC overlying a material to be patterned, the BARC having a refractive index and an absorbance. The BARC is modified such that, after the step of modifying, values of the refractive index and the absorbance are graded from first values at a first surface of the BARC to second values at a second surface of the BARC. The step of modifying is performed after the step of depositing.

21 Claims, 2 Drawing Sheets

OTHER PUBLICATIONS

D.J. Abdallah et al., "193nm dual layer organic B.A.R.C.s for high NA immersion lithography," Advances in Resist Technology and Processing, XXII, Proc. of SPIE vol. 5753, 2005, pp. 417-435.

D.C. Owe-Yang et al., "Development of high-performance tri-layer material," Advances in Resist Technology and Processing, XXV, Proc. of SPIE vol. 6923, 69232I, 2008, 9 pages.

Kilyoung Lee et al., "Optimization of BARC Process for Hyper-NA Immersion Lithography," Advances in Resist Technology and Processing, XXV, Proc. of SPIE vol. 6923, 69232R, 2008, 9 pages.

Nobuyuki N. Matsuzawa et al., "Optimization of Dual BARC Structures for Hyper-NA Immersion Lithography," Advances in Resist Technology and Processing, XXIII, Proc. of SPIE vol. 6153, 61531J, 2006, 12 pages.

Marc J. Van Der Reijden et al., "High and Hyper NA Immersion Lithography using Advanced Patterning Film APF™," IEEE/SEMI Advanced Semiconductor Manufacturing Conference, 2006, pp. 39-43.

Chris A. Mack, "The Lithography Expert: Desiging a bottom atireflection coating," http://www.solid-state.com/display_article/221615/28/none/none/Feat/The-Lithography-Expert:-Designing-a-bottom-antireflection-coatin, Microlithography World, Feb. 2005, 4 pages.

Chen, H. et al. "Optical-Gradient Antireflective Coatings for 157-nm Optical Lithography Applications," Applied Optics, vol. 43, No. 10, Apr. 1, 2004. pp. 2141-2145.

PCT International Search Report for PCT/US2009/061516 mailed Jan. 2, 2010.

Examination Report issued by the EPO on Feb. 6, 2012 for EP Application No. 09 741 161.5.

* cited by examiner

METHODS FOR PERFORMING PHOTOLITHOGRAPHY USING BARCS HAVING GRADED OPTICAL PROPERTIES

FIELD OF THE INVENTION

The present invention generally relates to methods for fabricating integrated circuit devices, and more particularly relates to methods for performing photolithography using bottom antireflective coatings having graded optical properties.

BACKGROUND OF THE INVENTION

The semiconductor or IC industry aims to manufacture ICs with higher and higher densities of devices on a smaller chip area to achieve greater functionality and to reduce manufacturing costs. This desire for large scale integration has led to a continued shrinking of circuit dimensions and device features. The ability to reduce the size of structures, such as gate lengths in field-effect transistors and the width of conductive lines, is driven by lithographic performance.

With conventional photolithography systems, light is provided through or reflected off a mask or reticle to form an image on a semiconductor wafer. Generally, the image is focused on the wafer to expose and pattern a layer of material, such as photoresist material, that is disposed on a target layer to be processed. In turn, the patterned photoresist material is utilized to define doping regions, deposition regions, etching regions, or other structures associated with ICs in one or more target layers of the semiconductor wafer. The photoresist material can also define conductive lines or conductive pads associated with metal layers of an IC. Further, the photoresist material can define isolation regions, transistor gates, or other transistor structures and elements.

As the number of individual devices incorporated in the design of a semiconductor integrated circuit increases, there is a growing need to decrease the minimum feature size, that is, the minimum width, the minimum space between individual elements of the devices, the minimum widths of holes or vias, and the like. As the minimum feature size decreases, it becomes increasingly difficult to adequately resolve the features during photolithography because of reflection of light from the photoresist material/target layer interface. Optical distortion causes a loss of the anticipated one-to-one correspondence between the image on the mask and the image created in the patterned photoresist material.

Bottom anti-reflective coatings (BARCs) are known and used to mitigate defects during the patterning of the target layer by attenuating or absorbing the light waves reflected from the target layer surface during photo exposure operations to improve image contrast. BARCs are typically interposed between the target layer and the photoresist so as to serve as a barrier that inhibits the reflected waves from traversing back through the photoresist and adversely affecting the imaging process, which helps in defining images. As feature sizes approach 45 nm and less, lithography using ArF exposure systems with high or hyper numerical aperture (NA) in the range of about 1.30 to about 1.35 is typically required so that the incident light rays can be projected at high propagation angles, which improves resolution. However, at such large propagation angles, the reflectance from the photoresist/BARC interface substantially increases.

Several solutions have been suggested to overcome the problems associated with increases in reflectance. For example, the use of two or more BARC films with different indices of refraction (n) and absorbance (k) have been recommended to overcome the shortcomings of single BARC systems. However, the use of two or more BARC films requires the deposition of two different films, both of which should be deposited optimally. This in turn, increases costs, decreases yield and throughput, and can result in higher defectivity. Graded BARCs with optical properties that change as a function of the thickness of the BARC also have been noted. These graded BARCs are fabricated using specialized vapor deposition processes that permit the composition of the BARC to change as the BARC is deposited. However, such process can be costly and require materials, equipment and processes that are not suitable for commercial production. Alternately, graded BARCs may be prepared using spin-on processes in which a graded material is produced by interfacial segregation of components in the spin-on formulation. In these instances, very precise control of materials behavior is required, which may ultimately limit general utility and achievable reflectivity control.

Accordingly, it is desirable to provide photolithography methods that utilize easily-integrated BARCs with graded optical properties during photolithography. In addition, it is desirable to provide methods for performing photolithography that allow for high NA imaging conditions while providing means for controlling reflection in an effective and cost-efficient manner. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for performing photolithography in accordance with an exemplary embodiment of the present invention is provided. The method comprises the steps of depositing a bottom antireflective coating overlying a material to be patterned, the bottom antireflective coating having a refractive index and an absorbance. The bottom antireflective coating is modified such that, after the step of modifying, values of the refractive index and the absorbance are graded from first values at a first surface of the bottom antireflective coating to second values at a second surface of the bottom antireflective coating. The step of modifying is performed after the step of depositing.

A method for fabricating a semiconductor device in accordance with an exemplary embodiment of the present invention is provided. The method comprises the steps of depositing a bottom antireflective coating overlying a material to be patterned and illuminating the bottom antireflective coating with a light having a wavelength of no more than about 222 nm. A photoresist is formed overlying the bottom antireflective coating after the step of illuminating.

A method for performing photolithography in accordance with an exemplary embodiment of the present invention is provided. The method comprises the steps of depositing a bottom antireflective coating overlying a material to be patterned, the bottom antireflective coating having a first refractive index and a first absorbance, which, when added together result in a first sum. The bottom antireflective coating is modified such that a surface of the bottom antireflective coating has a second refractive index and a second absorbance, which, when added together result in a second sum. The step of modifying is performed after the step of depositing. A photoresist layer is formed overlying the surface of the bottom antireflective coating after the step of modifying, wherein the photoresist layer has a third refractive index and a third absorbance, which, when added together result in a third sum. An absolute value of a difference between the second sum and the third sum is less than an absolute value of a difference between the first sum and the third sum.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Methods for performing photolithography utilizing high NA imaging conditions to achieve high resolution with minimal reflectance are provided herein. The photolithography processes employ BARCs having graded refractive indices and graded absorbances. Use of high NA imaging conditions and high propagation angles generally results in high reflectance from a photoresist/target material interface. While conventional BARCs attempt to minimize the reflectance, they typically require multiple layers and/or large thicknesses. Multiple layers and BARCs having large thicknesses are costly, time-consuming to fabricate, and challenging to integrate into pattern transfer processes. The photolithography methods of the various embodiments herein are able to maximize resolution while significantly minimizing reflectance by using single, easily-integrated, graded BARC layers.

Figure 1:
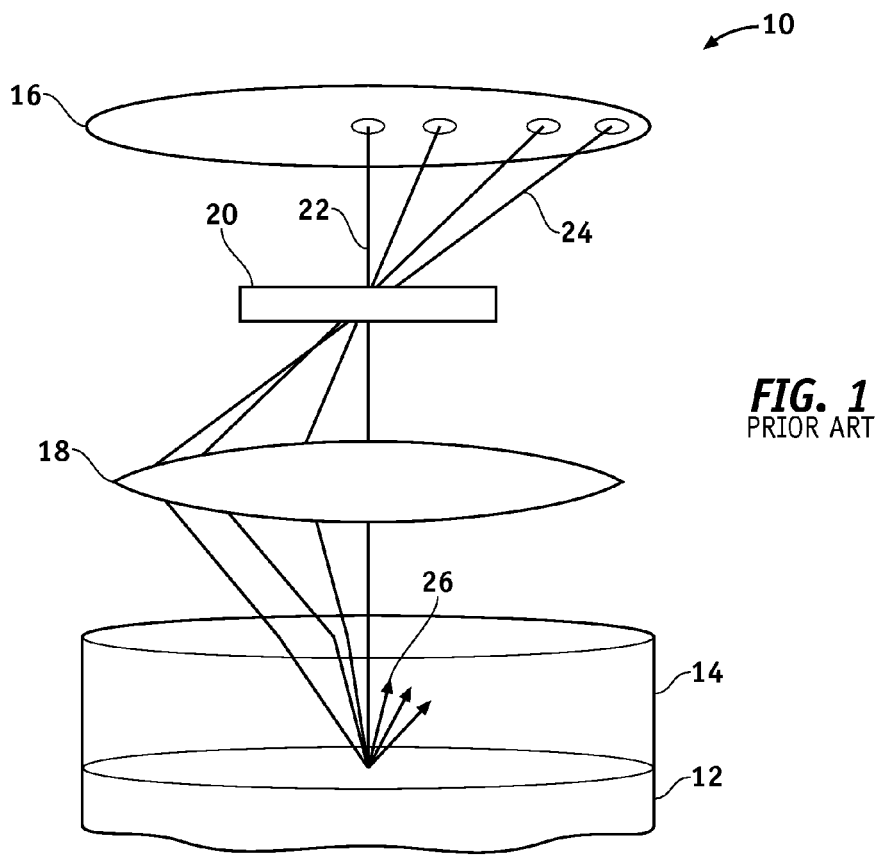
FIG. 1 is a schematic plan view of a conventional photolithography system.

FIG. 1 is a simplified schematic plan view of a conventional photolithography system 10 used to pattern a photoresist 14 overlying a target material 12. The lithography system 10 comprises a light source 16, such as an ArF excimer laser, and a projection lens 18. A reticle 20 having a patterned mask to be projected onto the photoresist is interposed between the light source 16 and the projection lens 18. When light 22 is projected from the light source perpendicularly onto the photoresist, that is, if the coherence of illumination (sigma; a) is zero, light that reflects from the photoresist/target material interface is minimal, although the resolution may be poor. As light 24 is projected further from the center of the light source 16, in other words, as sigma increases, resolution increases but reflection, indicated by arrows 26, also increases. In addition, because the reflectance is pitch-dependent, as the features of the reticle pattern decrease in dimension and/or increase in density, the reflectance increases and the final pattern of the photoresist can be severely distorted.

Figure 2:
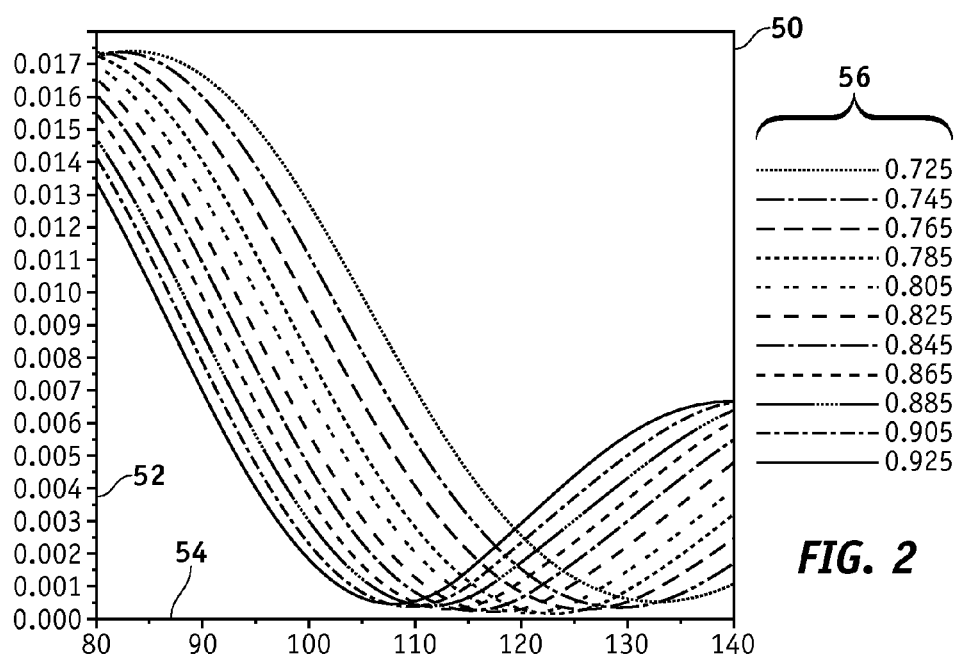
FIG. 2 is a simulated graph of the relationship between the thickness of a bottom antireflective coating underlying a photoresist, the coherence of illumination (sigma), and reflectance.

While BARCs are used to minimize reflectance from the bottom surface of the photoresist (i.e., the surface closest to the target material), the reflectance is dependent on BARC thickness. FIG. 2 is a simulated graph 50 of reflectivity 52 (normalized to incident intensity at the BARC top surface) from a photoresist/BARC interface as a function of a conventional BARC thickness 54 in units of nanometers (nm) with varying sigma 56 for a 1.35 numerical aperture (NA) dipole light source. As indicated by FIG. 2, as sigma increases for a given BARC thickness, reflectance increases. In addition, for light projected from a given sigma, reflectance decreases as the BARC thickness increases until a minimum reflectance is reached, at which point reflectance again increases. Minimal reflectance occurs when the BARC has a thickness such that reflectivity from the photoresist/BARC interface largely cancels reflectivity from the top surface of the photoresist, that is, the surface parallel but remote from the photoresist/BARC interface. Thus, for the simulation of FIG. 2, for light projected at a lower sigma, a minimal reflectance occurs when the BARC layer has a thickness of about 110 nm. However, for light projected at a higher sigma, while resolution may be better, a minimal reflectance occurs when the BARC has a thickness of about 130 nm. To minimize cost and increase throughput, it is desirable for the BARC thickness to be minimized. Preferably, the BARC has a thickness of no more than about 120 nm.

The reflectivity can be minimized while at the same time minimizing the thickness of the BARC layer by modifying the optical properties of the BARC layer, in accordance with an exemplary embodiment of the present invention. In a preferred embodiment of the present invention, the optical properties of the BARC are modified so as to be graded such that the optical properties of the BARC at a photoresist/BARC interface are closer in value to the optical properties of the photoresist than they would be if the BARC were not modified. In a more preferred embodiment, the optical properties of the BARC are modified so as to be graded such that the optical properties of the BARC at the photoresist/BARC interface are closer in value to the optical properties of the photoresist than they would be if the BARC were not modified and the optical properties of the BARC at the interface of the BARC and an underlying layer either remain close to the optical properties of the underlying layer or are closer in value to the optical properties of the underlying layer than they would be if the BARC were not modified.

Specifically, in accordance with an exemplary embodiment, the refractive index (n) and the absorbance (k) of the BARC are modified so that they are graded from first values at the photoresist/BARC interface to second, different values at the BARC/underlying layer interface. The refractive index and the absorbance can both increase from one interface to the other, both decrease from one interface to the other, or one can increase while the other decreases from one interface to the other. In one exemplary embodiment of the present invention, the absolute value of the sum of the refractive index and the absorbance of the modified BARC at the photoresist/BARC interface is closer in value to the absolute value of the sum of the refractive index and the absorbance of the photoresist than if the BARC had not been modified. In other words:

$$|(n_{MBARC}+k_{MBARC})-(n_{photoresist}+k_{photoresist})|<|(n_{BARC}+k_{BARC})-(n_{photoresist}+k_{photoresist})| \quad (1),$$

where $n_{MBARC}$ is the refractive index of the modified BARC, $k_{MBARC}$ is the absorbance of the modified BARC, $n_{photoresist}$ is the refractive index of the photoresist, $k_{photoresist}$ is the absorbance of the photoresist, $n_{BARC}$ is the refractive index of the un-modified BARC, and $k_{BARC}$ is the absorbance of the un-modified BARC.

In an optional embodiment of the present invention, in addition to the condition of equation (1), the absolute value of the sum of the refractive index and the absorbance of the BARC at the BARC/underlying layer interface is closer in value to the absolute value of the sum of the refractive index and the absorbance of the underlying layer than if the BARC had not been modified. In other words:

$$|(n_{MBARC}+k_{MBARC})-(n_{underlying}+k_{underlying})|<|(n_{BARC}+k_{BARC})-(n_{underlying}+k_{underlying})| \quad (2),$$

where $n_{underlying}$ is the refractive index of the underlying layer and $k_{underlying}$ is the absorbance of the underlying layer. However, because the BARC/underlying layer interface becomes more "hidden" as the absorbance k of the BARC increases, this embodiment may not be as useful with BARCs having high absorbances at the BARC/underlying layer interface.

Figure 3:
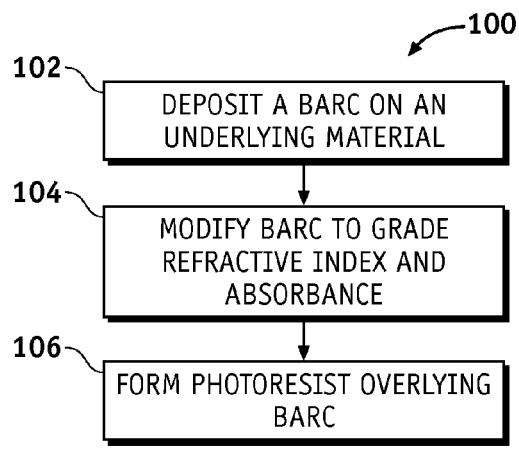
FIG. 3 is a flowchart of a method for performing photolithography in accordance with an exemplary embodiment of the present invention.

FIG. 3 is a flowchart of a method 100 for performing photolithography in accordance with an exemplary embodiment of the present invention. The method begins by depositing a BARC on an underlying material (step 102). In one embodiment, the underlying material is a target material ultimately to be patterned. Target materials contemplated herein may comprise any desirable substantially solid material. Particularly desirable target materials comprise films, glass, ceramic, plastic, metal or coated metal, or composite material. The target material may comprise a material common in the integrated circuit (IC) industry, such as silicon dioxide ($SiO_2$), carbon-doped silicon oxide (SiOCH), fluorine-doped silicon oxide (SiOF), silicon nitride (SiN), silicon carbide (SiC), silicon carbon nitride (SiCN), silicon oxycarbide (SiOC), and silicon oxynitride (SiON), and/or a material common in the packaging and circuit board industries, such as silicon, copper, aluminum, glass, or a polymer. In another exemplary embodiment, the underlying material layer comprises an organic planarizing layer that overlies a target material and forms a substantially planarized surface upon a topography of the target material, provides adequate absorption at the exposing wavelength, and is resilient to a target material plasma etch process. Examples of organic planarizing layers include the commercially available HM Series available from JSR Micro of Sunnyvale, Calif. or the ODL series available from Shin-Etsu MicroSi of Phoenix, Ariz.

The BARC is formed of a material that "reacts" with light having a wavelength of no greater than 222 nm, as described in more detail below. In one exemplary embodiment, the BARC material reacts with the light to produce chemically active species, such as, for example, acids or bases. In another exemplary embodiment, the BARC material undergoes bond cleavage or bond rearrangement when illuminated with light producing volatile species or a species with optical properties that are changed upon illumination.

In one exemplary embodiment, the BARC material comprises an organic polymeric material that comprises functional groups that undergo bond cleavage or bond rearrangement when illuminated with light having a wavelength of 222 nm or less. Such organic polymeric materials include, but are not limited to, spin-on organic materials that are applied as a liquid formulation to a spinning underlying material. Examples of such materials include spin-on ARC products available from Brewer Science, Inc. of Rolla, Mo. or ARC products available from Rohm & Haas Electronic Materials of Marlboro, Mass.

In another exemplary embodiment, the BARC is formed of an inorganic-based material such as a silicon-based, gallium-based, germanium-based, arsenic-based, or boron-based compound, or combinations thereof. Examples of silicon-based compounds comprise alkylsiloxanes, alkylsilsesquioxanes, arylsiloxanes, arylsilsesquioxanes, alkenyl siloxanes, alkenylsilsesquioxanes, and mixtures thereof. Some specific examples include, but are not limited to, methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, silicate polymers, silsilic acid derivatives, and mixtures thereof. As used herein, inorganic-based materials also include siloxane polymers and block polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four, and derivatives of silsilic acid. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, and the like. Examples of such materials include the SHB-series coatings from Shin-Etsu MicroSi of Phoenix, Ariz., or the UVAS-series coatings from Honeywell Electronic Materials of Tempe, Ariz. In one embodiment, the BARC comprise at least 15% silicon.

The BARC may be applied to the underlying layer using any suitable method, such as, for example, a conventional spin-on deposition technique, spray coating, extrusion coating, vapor deposition, or chemical vapor deposition. In one exemplary embodiment, the BARC is applied so that it has a thickness in the range of about 30 nm to about 120 nm. In a preferred embodiment, the BARC has a thickness in the range of about 30 nm to about 100 nm.

After the BARC is deposited, the BARC is modified so that its refractive index and absorbance increase or decrease in value from a bottom surface of the BARC, that is, the surface at the BARC/underlying material interface, to a top surface, that is, a surface parallel to but remote from the bottom surface (step 104). In one exemplary embodiment of the present invention, the refractive index and the absorbance of the BARC are graded by illuminating the BARC with light having a wavelength of no greater than about 222 nm. In a preferred embodiment, the BARC is illuminated with light having a wavelength of no greater than about 172 nm. Preferably, the BARC is illuminated in a substantially oxygen-free ambient, as oxygen can be very light-absorbing at wavelengths around 172 nm or less. As used herein, the term "substantially oxygen-free ambient" means an ambient having no more than about 10 parts per million oxygen. In one embodiment, the BARC is illuminated in a vacuum. In another embodiment, the BARC is illuminated in an inert gas ambient. Suitable inert gases for use during the illumination include, but are not limited to, nitrogen, helium, argon, or combinations thereof. Preferably, the BARC is illuminated at room temperature (from about 15° C. to about 25° C.). The BARC is illuminated for a time period sufficient to modify the refractive index and the absorbance so that they are graded, as explained in detail above. In one exemplary embodiment, the BARC is illuminated using a dose of light ranging from about 100 millijoules/square centimeter (mJ/cm$^2$) to about 2 J/cm$^2$.

Figure 4:
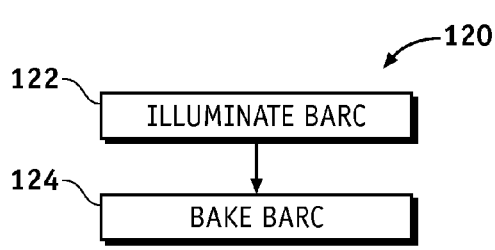
FIG. 4 is a flowchart of a method for modifying the refractive index and absorbance of a bottom antireflective coating of the method of FIG. 3, in accordance with an exemplary embodiment of the present invention.

Referring momentarily to FIG. 4, in another exemplary embodiment of the present invention, a method 120 for grading the refractive index and the absorbance by modifying the BARC (step 104 of FIG. 3) begins by illuminating the BARC with light having a wavelength of no greater than about 222 nm (step 122), as described above. After the illumination, the refractive index and the absorbance are modified by baking the BARC (step 124). In this regard, if, during the light illumination step, chemically active species are produced, the bake step may result in further chemical reactions that may grade or facilitate grading of the optical properties of the BARC. Alternatively, or in addition, if, during the light illumination step, volatile species are produced, the bake step may cause the evaporation of the species. Moreover, if, during the light illumination step, voids are created in the BARC, the voids can be eliminated with the bake step. In one embodiment, after illumination, the BARC is baked a temperature no less than about 120° C. for about 10 seconds to about 2 minutes. In another embodiment, the BARC can be illuminated and baked simultaneously. In this regard, the BARC is illuminated with light having a wavelength of no greater than 222 nm, preferably in an oxygen-free ambient. During illumination, the BARC is heated to a temperature of no less than 120° C. and is illuminated and heated simultaneously using a dose of light ranging from about 100 mJ/cm$^2$ to about 2 J/cm$^2$.

Returning to FIG. 3, after the BARC is modified, a photoresist is deposited overlying the BARC (step 106). As used herein, the term "overlying" encompasses the terms "on" and "over". Accordingly, the photoresist can be disposed directly on the BARC or may be disposed over the BARC such that one or more other materials are interposed between the photoresist and the BARC. Examples of materials that may be interposed between the photoresist and the BARC include ancillary spin-on coatings, such as developable BARCs, previously patterned photoresist features, and the like. The photoresist may be any conventional photoresist such as photoresist TArF P6239 available from Tokyo Ohka Kogyo Co., Ltd of Japan and EPIC™ 2370 available from Rohm and Haas Electronic Materials of Marlboro, Mass. The semiconductor fabrication may then continue with the patterning of the photoresist and the BARC, the etching, doping, or other processing of the underlying layer, and the subsequent removal of the photoresist and the BARC using, for example, conventional methods and techniques.

Figure 5:
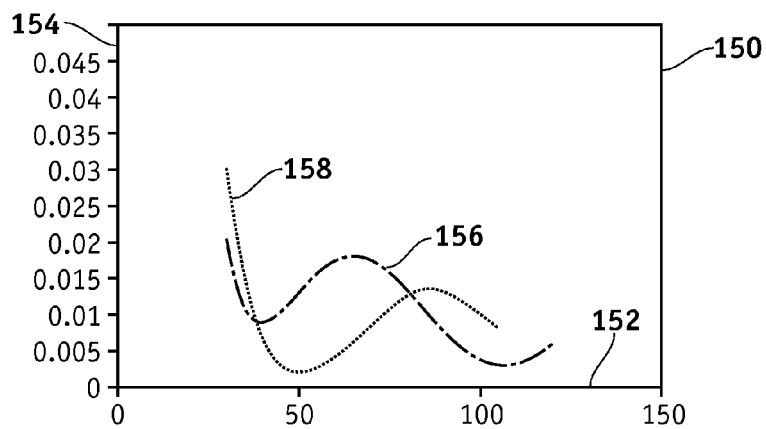
FIG. 5 is a simulated graph of the relationship between reflectance and the thickness of a graded bottom antireflective coating formed in accordance with the method of FIGS. 3 and 4 and the thickness of an un-graded bottom antireflective coating.
Figure 6:
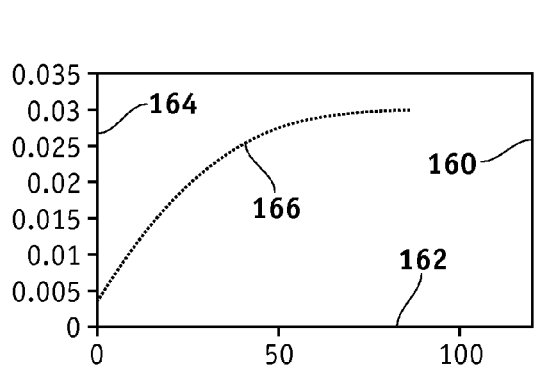
FIG. 6 is a simulated graph of the refractive index at a specified depth into the graded bottom antireflective coating of FIG. 5.
Figure 7:
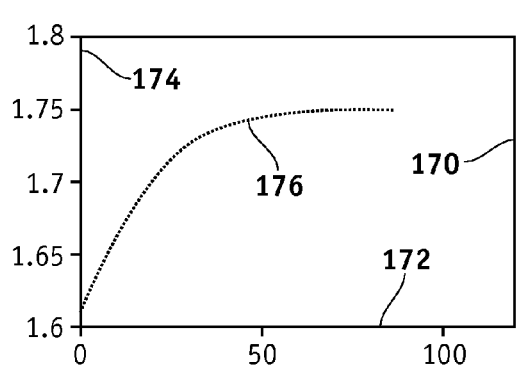
FIG. 7 is a simulated graph of the absorbance at a specified depth into the graded bottom antireflective coating of FIG. 5.

FIG. 5 is simulated graph 150 of the reflectivity 154 of a semiconductor substrate (normalized to incident intensity at the BARC top surface) as a function of BARC thickness 152 (in nm), FIG. 6 is a simulated graph 160 of the absorbance (k) 164 as a function of BARC thickness 162, and FIG. 7 is a simulated graph of the refractive index (n) 174 as a function of BARC thickness 172. The simulated graphs are provided for illustration purposes only and are not meant to limit the various embodiments of the present invention in any way. The graphs are based on calculations generated using PROLITH® software available from KLA-Tencor Corp. of Milipitas, Calif. The model assumed a semiconductor substrate comprising: 1) an organic planarizing layer having a thickness ranging from about 40 to about 120 nm, a refractive index of 1.4, and an absorbance of 0.6; 2) an overlying BARC layer having an initial thickness ranging from about 30 nm to about 120 nm, an initial refractive index of 1.75, and an initial absorbance of 0.3; 3) a Pi6-001ME photoresist available from Tokyo Ohka Kogyo Co. Ltd. of Japan having a thickness of 120 nm, a refractive index of 1.68, and an absorbance of 0.044; and 4) a TCX-041 topcoat available from JSR Corp. of Japan having a thickness of 70 nm, a refractive index of 1.53, and an absorbance of 0. The extinction coefficient was assumed to be 3.3. The exposure conditions included a NA of 1.35, a dipole blade of 35, an inner sigma of 0.73 and an outer sigma of 0.93. The behavior of the continuously graded BARC was approximated by simulating the behavior of a multilayer film composed of 10 discrete sub-layers, as PROLITH does not allow analysis of continuously graded films. Each sub-layer was modeled as being $1/10^{th}$ of the full BARC thickness. Optical properties of each of the 10 sub-layers were defined based on continuous models analogous to those shown in FIGS. 6 and 7.

Referring to FIG. 5, curve 156 represents the relationship between BARC thickness and reflectivity for a non-graded, that is, a non-illuminated BARC, while curve 158 represents the relationship between reflectivity and BARC thickness for a graded BARC that was illuminated with light of 222 nm wavelength in the manner described above. While minimum reflectance occurs at an un-graded BARC thickness of greater than 100 nm, approximately the same minimal reflectance occurred for a substantially thinner, graded BARC of about 50 nm.

FIG. 6 illustrates the relationship between the refractive index of the graded BARC and the BARC thickness and FIG. 7 illustrates the relationship between the absorbance of the graded BARC and the BARC thickness. A thickness of zero in both graphs 160 and 170 represents the photoresist/BARC interface. The ends of curves 166 and 176 indicate the BARC/underlying layer interface. As noted above, it is desirable to minimize the difference between the sum of the refractive index and the absorbance of the photoresist and the sum of the refractive index and the absorbance of the graded BARC at the photoresist/BARC interface. The sum of the refractive index and the absorbance of the photoresist was calculated at 1.724 (1.68+0.044). The sum of the refractive index and the absorbance of the un-graded BARC at the photoresist/BARC interface was calculated at 2.05 (1.75+0.03). In contrast, the sum of the refractive index and absorbance of the graded BARC at the photoresist/BARC interface was calculated at about 1.68 (about 1.62+about 0.04). Accordingly, |(1.724−1.68)|<|(1.724−2.05)|, or 0.044<0.326. Thus, by grading the BARC using the various embodiments of the methods disclosed herein, a significant improvement in the control of reflectivity at the photoresist/BARC interface achieved.

Similarly, as noted above, it is desirable to minimize the difference between the sum of the refractive index and the absorbance of the BARC and the sum of the refractive index and the absorbance of the underlying layer at the BARC/underlying layer interface. The sum of the refractive index and the absorbance of the underlying layer was calculated at 2.00 (1.4+0.6). The sum of the refractive index and absorbance of the graded BARC at the BARC/underlying layer interface was calculated at about 2.05 (about 1.75+about 0.3). Because the refractive index and absorbance were graded, this sum is the same as the sum of the refractive index and the absorbance of an un-graded BARC at the photoresist/BARC interface, which is close to 2.00. Accordingly, by illuminating a deposited BARC so as to grade the optical properties of the BARC, control of reflectivity with respect to both the photoresist and the underlying layer are accomplished.

Accordingly, photolithography methods that utilize easily-integrated BARCs with graded optical properties during photolithography are provided. The photolithography processes employ illumination of deposited BARCs so that the illuminated BARCS have graded refractive indices and graded absorbances. In this regard, the graded BARCs of the various embodiments herein are able to significantly minimize reflectance with substantially smaller thicknesses. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for performing photolithography, the method comprising the steps of:
depositing a bottom antireflective coating overlying a material to be patterned, the bottom antireflective coating having a refractive index and an absorbance; and
illuminating the bottom antireflective coating with light such that, after the step of illuminating, values of the refractive index and the absorbance are graded from first values at a first surface of the bottom antireflective coating to second values at a second surface of the bottom antireflective coating, wherein the step of illuminating is performed after the step of depositing; and
forming a photoresist overlying the bottom antireflective coating, the step of forming performed after the stet of illuminating.

2. The method of claim 1, wherein the step of depositing comprises depositing the bottom antireflective coating to a thickness in a range of about 30 nm to about 120 nm.

3. The method of claim 2, wherein the step of depositing comprises depositing the bottom antireflective coating to a thickness in a range of about 30 nm to about 100 nm.

4. The method of claim 1, wherein the step of illuminating comprises illuminating the bottom antireflective coating with a light having a wavelength of no greater than about 222 nm.

5. The method of claim 4, wherein the step of illuminating comprises illuminating the bottom antireflective coating with a light having a wavelength of no greater than about 172 nm.

6. The method of claim 4, wherein the step of illuminating comprises illuminating using a dose of light ranging from about 100 mJ/cm$^2$ to about 2 J/cm$^2$.

7. The method of claim 4, further comprising heating the bottom antireflective coating after the step of illuminating.

8. The method of claim 7, wherein the step of heating comprises heating the bottom antireflective coating to a temperature no less than about 120° C.

9. The method of claim 8, wherein the step of heating comprises heating the bottom antireflective coating to a temperature no less than about 120° C. for about 10 seconds to about 2 minutes.

10. The method of claim 4, wherein the step of illuminating comprises illuminating the bottom antireflective coating in a substantially oxygen-free ambient.

11. The method of claim 4, wherein the step of illuminating further comprises heating the bottom antireflective coating during the step of illuminating.

12. The method of claim 1, wherein:
the step of depositing comprises depositing a bottom antireflective coating having a first refractive index and a first absorbance, which, when added together result in a first sum;
the step of forming comprises forming a photoresist having a second refractive index and a second absorbance, which, when added together result in a second sum;
the step of illuminating comprises illuminating the bottom antireflective coating such that a surface of the bottom antireflective coating has a third refractive index and a third absorbance, which, when added together result in a third sum; and
an absolute value of a difference between the second sum and the third sum is less than an absolute value of a difference between the first sum and the second sum.

13. A method for fabricating a semiconductor device, the method comprising the steps of:
depositing a bottom antireflective coating overlying a material to be patterned;
illuminating the bottom antireflective coating with a light having a wavelength of no more than about 222 nm; and
forming a photoresist overlying the bottom antireflective coating after the step of illuminating.

14. The method of claim 13, wherein the step of illuminating comprises illuminating the bottom antireflective coating with a light having a wavelength of no more than about 172 nm.

15. The method of claim 13, further comprising the step of heating the bottom antireflective coating, the step of heating performed after the step of illuminating and before the step of forming the photoresist.

16. The method of claim 15, wherein the step of heating comprises heating the bottom antireflective coating to a temperature no less than about 120° C.

17. The method of claim 16, wherein the step of heating comprises heating the bottom antireflective coating to a temperature no less than about 120° C. for about 10 seconds to about 2 minutes.

18. The method of claim 13, wherein the step of illuminating comprises illuminating the bottom antireflective coating in a substantially oxygen-free ambient.

19. The method of claim 13, further comprising the step of heating the bottom antireflective coating, the step of heating performed during the step of illuminating.

20. The method of claim 13, wherein the step of depositing comprises depositing the bottom antireflective coating to a thickness in a range of about 30 nm to about 120 nm.

21. A method for performing photolithography, the method comprising the steps of:
depositing a bottom antireflective coating overlying a material to be patterned, the bottom antireflective coating having a first refractive index and a first absorbance, which, when added together result in a first sum;
modifying the bottom antireflective coating such that a surface of the bottom antireflective coating has a second refractive index and a second absorbance, which, when added together result in a second sum, wherein the step of modifying is performed after the step of depositing; and
forming a photoresist layer overlying the surface of the bottom antireflective coating after the step of modifying, wherein the photoresist layer has a third refractive index and a third absorbance, which, when added together result in a third sum, and wherein an absolute value of a difference between the second sum and the third sum is less than an absolute value of a difference between the first sum and the third sum.

* * * * *